United States Patent [19]

Honma et al.

[11] 4,191,851
[45] Mar. 4, 1980

[54] FM NOISE SUPPRESSOR

[75] Inventors: Makoto Honma, Hamurs; Takao Inoue, Kodaira, both of Japan

[73] Assignee: Hitachi, Ltd., Japan

[21] Appl. No.: 891,032

[22] Filed: Mar. 28, 1978

[30] Foreign Application Priority Data

Mar. 30, 1977 [JP] Japan .................................. 52/34577

[51] Int. Cl.² .............................................. H04H 5/00
[52] U.S. Cl. .................................. 179/1 GD; 325/478
[58] Field of Search ............ 179/1 GM, 1 GE, 1 GD; 325/478, 480, 492

[56] References Cited

U.S. PATENT DOCUMENTS

| | | | |
|---|---|---|---|
| 3,634,626 | 1/1972 | Staley | 179/1 GM |
| 3,662,113 | 5/1972 | Von Recklinghausen | 179/1 GM |
| 3,739,285 | 6/1973 | Hepp | 179/1 GD |
| 3,999,132 | 12/1976 | Smith | 179/1 GM |
| 4,066,845 | 1/1978 | Kishi | 325/478 |

FOREIGN PATENT DOCUMENTS 2118036 7/1972 France.
2349907 4/1977 France.

Primary Examiner—Douglas W. Olms
Attorney, Agent, or Firm—Craig and Antonelli

[57] ABSTRACT

An FM noise suppressor comprising a detector circuit which detects noise pulses included in a detected stereo composite signal, a gate circuit which is enabled or disabled by an output from the detector circuit, and a reproducing circuit which receives the stereo composite signal without intervention of the gate circuit and which reproduces a subcarrier signal for FM stereo signal demodulation in synchronism with a pilot signal included in the received stereo composite signal. A decoder demodulates stereo signals on the basis of an output signal of the gate circuit and the output signal of the reproducing circuit.

2 Claims, 4 Drawing Figures

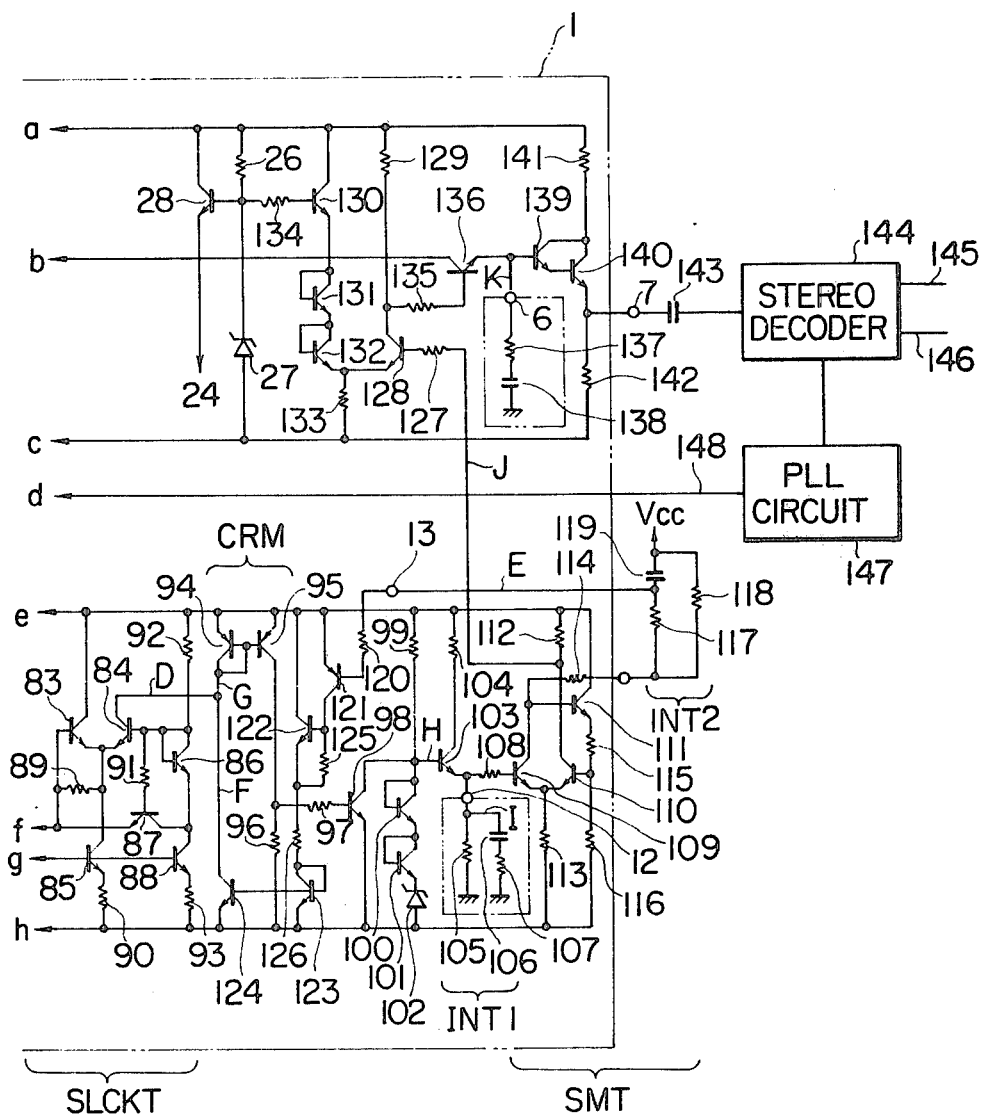

FM NOISE SUPPRESSOR

List of Prior Art (37 CFR 1. 56 (a))

The following reference is cited to show the state of the art:
British Pat. No. 1,279,756

BACKGROUND OF THE INVENTION

This invention relates to a voice demodulation system, and more particularly to an FM noise suppressor for obtaining an FM detection signal i.e. a composite stereo signal free from any jamming signal i.e. noise pulses.

A circuit for eliminating a jamming signal included in an FM detection signal is known in the art.

For example, in a circuit disclosed in British Pat. No. 1,279,756, there are used a jamming signal detector which detects a jamming signal in the FM detection signal, a gate circuit which is controlled by the detected signal from the detector and which receives the FM detection signal, a capacitor which receives an output from the gate circuit, and a parallel resonance circuit which resonates with a pilot signal of 19 KHz for FM stereo demodulation. In this circuit, during the period in which the gate circuit is disabled by the detected jamming signal, the capacitor holds a voice signal level immediately before the gate circuit is disabled. In addition, even when no pilot signal appears at the output of the gate circuit due to the disablement thereof, a signal of 19 KHz corresponding to the lost pilot signal is fed from the parallel resonance circuit. As a result, a signal less affected by the jamming signals is obtained from the FM detection signal including the jamming signals.

In the above construction for eliminating the jamming signals, however, the parallel resonance circuit must provide the 19 KHz signal in phase with the pilot signal being broadcast during the period in which the pilot signal is missing, and a high accuracy and stability are demanded of the resonance frequency. In order to make the resonance frequency exactly 19 KHz, an adjustment is necessary. Moreover, each time one jamming signal is detected, the gate circuit is disabled for a predetermined period of time irrespective of the duration of the jamming signal. Therefore, when the number of jamming signals detected per unit time is large, the period of time of the pilot signal for synchronization to be supplied to the parallel resonance circuit decreases drastically.

SUMMARY OF THE INVENTION

It is accordingly an object of this invention to provide an FM noise suppressor which can effectively utilize a received pilot signal even when jamming signals are suppressed.

Another object of this invention is to provide an FM stereo voice demodulation system with little noise.

Still another object of this invention is to provide an FM noise suppressor which is suitable for an FM stereo voice demodulation system employing a phase locked loop.

Yet another object of this invention is to provide a voice demodulation system which is suitable for the form of a semiconductor integrated circuit device.

According to this invention, there is provided an FM noise suppressor characterized by comprising detection means which receives an FM detection signal and which detects a jamming signal included in this detection signal, gate means which receives the FM detection signal and the gating of which is controlled by the detection means, and means which receives the FM detection signal without the intervention of the gate means and which reproduces a subcarrier signal for FM stereo signal demodulation in synchronism with a pilot signal included in this detection signal.

According to one aspect of performance of this invention, there is provided an FM noise suppressor characterized in that the aforecited reproduction means is constructed of a phase locked loop.

According to a further aspect of performance of this invention, there is provided an FM noise suppressor characterized in that the output signal of the aforecited detection means is impressed on the aforecited gate means through a circuit which prohibits quick repeated operations of the gate means.

Other objects and features of this invention will become apparent from the following description taken in conjunction with the accompanying drawings.

BRIEF DESCRIPTION OF THE DRAWINGS

FIGS. 1A and 1B are circuit diagrams showing an embodiment of this invention.

PREFERRED EMBODIMENT OF THE INVENTION

Figure 1A:
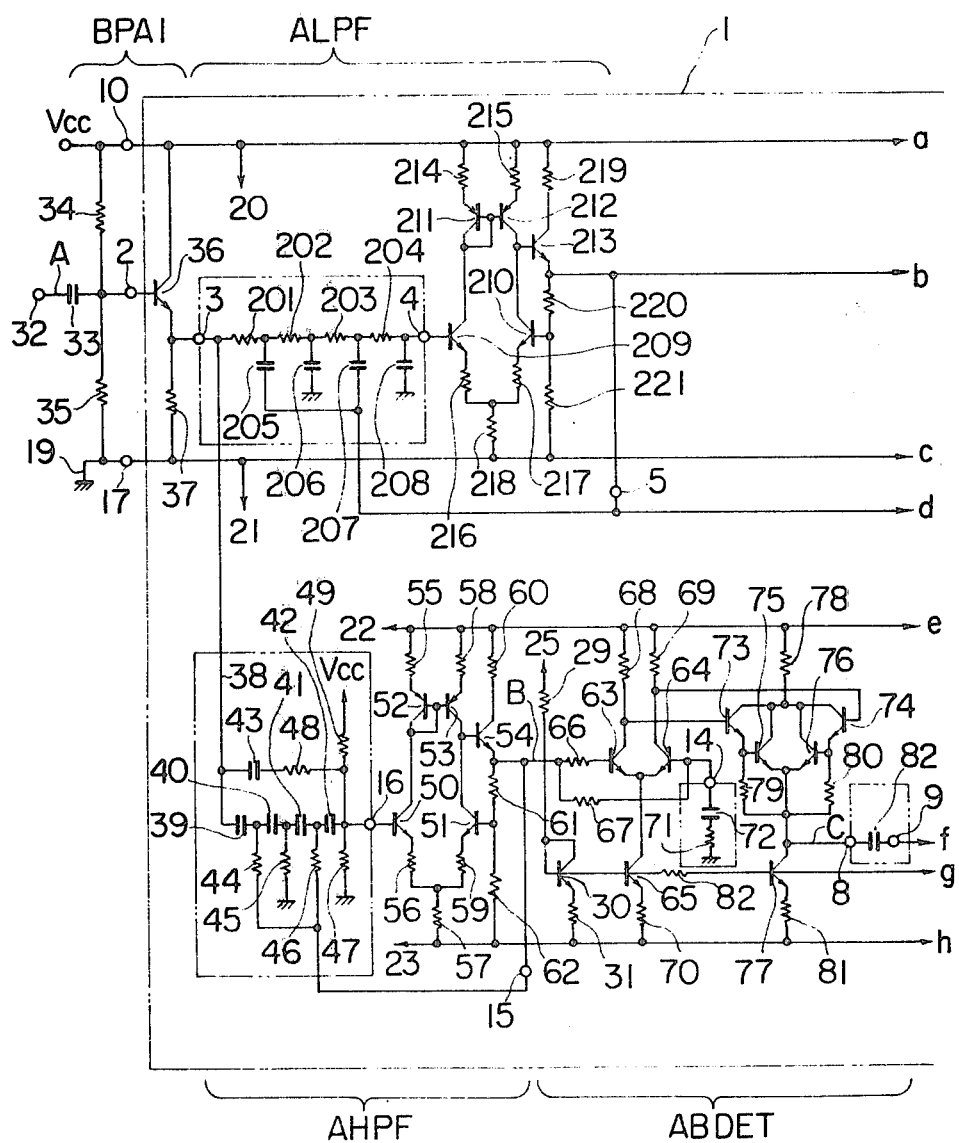
Figure 3:
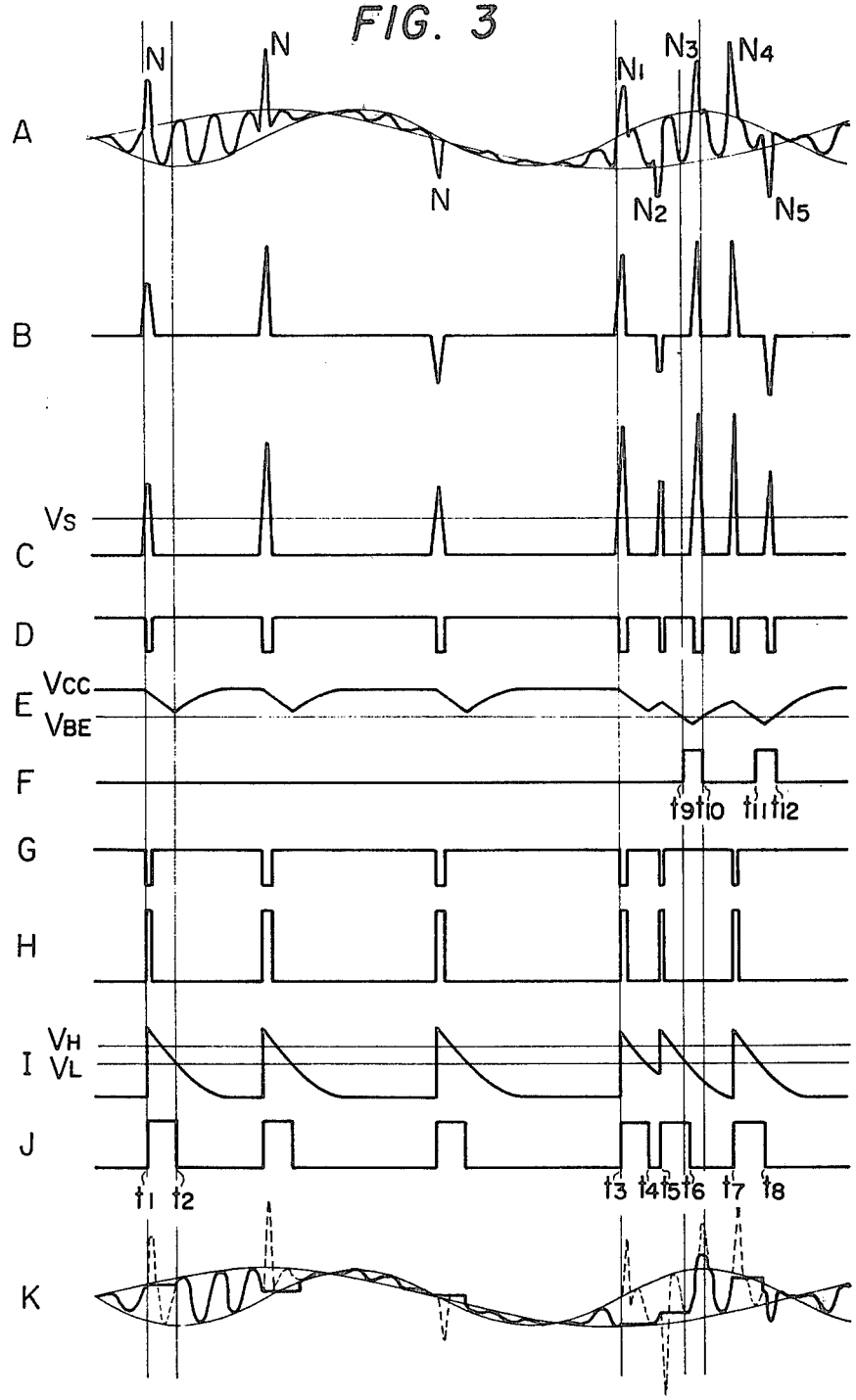
FIG. 3 is a diagram showing signal waveforms at various parts of the circuit of the embodiment.

FIGS. 1A and 1B show a circuit embodying this invention. In these figures, a part enclosed within a broken line as indicated at 1 is a portion which is put into the form of a semiconductor integrated circuit device. Numerals 2 to 17 designate external terminals of the portion 1. The terminal 10 is supplied with a supply voltage $V_{CC}$, and the terminal 17 is grounded. Lines 20 and 22, lines 21 and 23, and lines 24 and 25 are respectively connected to each other within the semiconductor integrated circuit device. A to K in FIG. 3 show signal waveforms of various parts in FIGS. 1A and 1B.

In FIG. 1A, an FM detection signal is applied to a terminal 32. Known means for obtaining the FM detection signal can be used. As is well known, in the case of reception of a stereo broadcast, the FM detection signal is made up of a composite signal which includes a sum signal between a right signal and a left signal, a difference signal modulated by a subcarrier of 38 KHz, and a pilot signal of 19 KHz. As shown at A in FIG. 3, the composite signal includes undesirable jamming signals N.

The detection signal is impressed through a coupling capacitor 33 on an emitter follower transistor 36 which is used as a buffer amplifier circuit BPA1. An output of the emitter follower transistor 36 is supplied through the terminal 3 to an active low-pass filter circuit ALPF and an active high-pass filter circuit AHPF.

The active high-pass filter circuit AHPF has a CR circuit which receives the FM detection signal from a line 38 and which is composed of capacitors 39 to 43 and resistors 44 to 49, an amplifier circuit which receives an output of the CR circuit at the terminal 16 and which is composed of transistors 50 to 54 and resistors 55 to 62, and a feedback path which is connected to an output end of the amplifier circuit and which is connected to the CR circuit through the terminal 15.

The active high-pass filter circuit AHPF has its cutoff frequency selected so as to lie outside the band of the composite signal. By way of example, a cutoff frequency of approximately 100 KHz is selected. Since the jamming signals N as illustratively given at A in FIG. 3 contain high frequency components in at least the rising or decaying periods thereof, the active high-pass filter circuit AHPF delivers to its output terminal signals which coincide with at least the timing of the rise and fall of the jamming signals N as shown at B in FIG. 3.

The output of the active high-pass filter circuit AHPF is fed to an absolute value-detecting circuit ABDET. The absolute value-detecting circuit ABDET consists of a differential amplifier circuit which is composed of transistors 63 and 64, resistors 66 to 69 and 71 and a capacitor 72, and a detector circuit which is composed of transistors 73 and 76 and resistors 79 and 80. A constant-current source for the differential amplifier circuit is constructed of a transistor 65 and a resistor 70. The transistor 65 is biased by a bias circuit which receives an output of a constant-voltage circuit (FIG. 1B) composed of a zener diode 27 and a resistor 26 and which is made up of a transistor 28, a resistor 29, a transistor 30 in diode connection and a resistor 31. The detector circuit includes a constant-current circuit composed of a transistor 77 and a resistor 81, and the transistor 77 receives a bias current from the diode-connected transistor 30 through a resistor 82.

The differential amplifier circuit which receives the signal from the active high-pass filter circuit AHPF provides differential outputs at a pair of output terminals thereof. Since the base of the transistor 64 is biased by a series circuit consisting of the resistor 67, the capacitor 72 and the resistor 71, this differential amplifier circuit becomes in phase with the potential at the base of the transistor 63 for low frequency signals and thereof produces a large differential gain for only high frequency signals.

In the detector circuit, the transistors 73 and 75 and those 74 and 76 which are respectively in Darlington connection have their conductive states changed in response to the differential outputs of the differential circuit. The potential of the detector circuit at the terminal 8 is determined in correspondence with voltage drops across the resistors 68 and 69. When the voltage drops of the resistors 68 and 69 have balanced, that is, when collector currents of the transistors 63 and 64 have balanced, the potential of the terminal 8 becomes a reference bias potential. When the bias potential of the base of the transistor 63 has become higher than the reference bias potential of the circuit in response to the input signal of the differential amplifier circuit, the collector potential of the transistor 64 rises above that of the transistor 63, and hence, the transistors 74 and 76 turn "on". As a result, the potential at the terminal 8 rises with the increase in the collector potential of the transistor 64.

When the base potential of the transistor 63 has become lower than the reference bias potential of the circuit, the collector potential of the transistor 63 rises above that of the transistor 64, so that the transistors 73 and 75 turn "on" and the potential of the terminal 8 rises. As a result, the absolute value-detecting circuit ABDET delivers a signal shown at C in FIG. 3 in response to the input signal from the active high-pass filter circuit AHPF as shown at B in FIG. 3.

The output of the absolute value-detecting circuit ABDET as has appeared at the terminal 8 is supplied to a slice circuit SLCKT through the capacitor 82 as well as the terminal 9. The slice circuit SLCKT is made up of transistors 83 to 88 and resistors 89 to 93. In the emitter-coupled transistors 83 and 84, the transistor 84 has its base biased by a bias circuit which is made up of the resistor 92, the diode-connected transistor for temperature compensation 86, the constant-current transistor 88 receiving a bias current from the diode-connected transistor 30 through the resistor 82, and the resistor 93 for setting a current value. The base of the transistor 83 receives a bias potential from the emitter of the transistor 87. Since the base of the transistor 87 is biased with the resistor 91 intervening between it and the base bias point of the transistor 84, the base bias potential of the transistor 83 is lower than that of the transistor 84 by the sum between the voltage drop of the resistor 91 and the base-emitter forward voltage drop of the transistor 87. In the absence of the jamming signal, the transistor 83 is in the "off" state, and the transistor 84 is in the "on" state. When the base bias potential of the transistor 83 has risen to or beyond the sum of the voltage drops, the transistor 83 conversely attains the "on" state and the transistor 84 the "off" state. A slice level $V_S$ for the signal entering the terminal 9 is determined by the resistor 91 and the transistor 87. The output current of a constant-current circuit consisting of the transistor 85 and the resistor 90, that is, the collector current of the transistor 85, flows to the transistor 83 or 84 according to the input signal level at the terminal 9.

Since the capacitance of the capacitor 82 is made a value sufficiently large relative to signals to be handled, the signal at the terminal 8 as shown at C in FIG. 3 appears at the terminal 9 with its amplitude remaining unchanged. The transistor 84 turns "off" for the input signal exceeding the slice level $V_S$ indicated at C in FIG. 3, so that its collector current becomes as shown at D in FIG. 3.

The collector current of the transistor 84 as depicted at D in FIG. 3 is supplied to a current Miller circuit CRM consisting of transistors 94 and 95. Since the current Miller circuit CRM is also supplied with a collector current as shown at F in FIG. 3 from a transistor 124 to be described later, it is fed with a sum current as shown at G in FIG. 3. The variation of current flowing through a point G in FIG. 1B as indicated at G in FIG. 3 appears also at the collector of the current Miller transistor 95. Owing to the collector current of the transistor 95, a voltage appears across a resistor 96.

A transistor 98 receives the terminal voltage of the resistor 96 between the base and emitter thereof through a resistor 97. The transistor 98 turns "on" and "off" in correspondence with the current at the point G of the current Miller circuit.

As shown at H in FIG. 3, the collector potential of the transistor 98 becomes a high potential only when the slice circuit SLCKT has detected the jamming signal. To the collector of the transistor 98, there is connected a voltage clamp circuit which is made up of a resistor 99, diode-connected transistors 100 and 101 for temperature compensation, and a zener diode 102. Accordingly, the highest potential of the collector of the transistor 98 is determined by this voltage clamp circuit.

The signal at a point H in FIG. 1B is supplied through a transistor 103 and the terminal 12 to an integration circuit INT1 which is made up of resistors 105 and 107 and a capacitor 106. On the ground that the potential at the point H becomes a high potential as shown at H in FIG. 3, the transistor 103 attains the "on" state and the capacitor 106 is charged. When the potential at the point H has become a low potential which is determined by the "on" state of the transistor 98, the base-emitter path of the transistor 103 is reverse-biased by a voltage which is generated by the capacitor 106 which is in the charged state, and the transistor 103 attains the "off" state. During the period in which the transistor 103 is in the "off" state, charges stored in the capacitor 106 are discharged through the resistors 105 and 107. In consequence, the potential at the terminal 12 changes as shown at I in FIG. 3 in response to the signal shown at H in FIG. 3.

The output signal of the integration circuit INT1 at the terminal 12 is supplied through a resistor 108 to a Schmitt trigger circuit SMT. The Schmitt trigger circuit SMT is made up of transistors 109 to 111, resistors 112 to 118 and a capacitor 119. This Schmitt trigger circuit SMT has two trigger levels $V_H$ and $V_L$ for the signal appearing at the terminal 12, and delivers a signal shown at J in FIG. 3 to the juncture between the transistor 110 and the resistor 112, i.e., a point J, in response to the signal shown at I in FIG. 3.

The signal at the point J is supplied through a resistor 127 to the base of a transistor 128. The emitter of the transistor 128 is connected to a constant-voltage circuit which receives a bias voltage from the constant-voltage circuit composed of the resistor 26 and the zener diode 27 and which is made up of a resistor 134, a transistor 130, temperature compensating transistors 131 and 132 in diode connection, and a resistor 133. The emitter potential of the transistor 128 is set so that the base-emitter path thereof may become zero- or reverse-biased in response to the low potential at the point J and that it may become forward-biased in response to the high potential at the point J. In response to the signal shown at J in FIG. 3, the collector potential of the transistor 128 lies at a low potential after the detection of the jamming signal and for a period of time which is determined by the integration circuit composed of the elements 105 to 107 and the Schmitt trigger circuit composed of the elements 109 to 119, and it lies at a high potential at all the other times.

The signal at the collector of the transistor 128 is supplied through a resistor 135 to the base of a gate transistor 136.

The gate transistor 136 is placed in the "off" state by the high potential of the point J, and in the "on" state by the low potential of the point J.

In consequence of the "on-off" operations of the transistor 136, the FM detection signal from the output end of the active low-pass filter circuit ALPF is cut off for a predetermined time after the detection of the jamming signal and is delivered to the emitter side of the transistor 136. As apparent from FIG. 1A, the active low-pass filter circuit ALPF is made up of a filter circuit composed of resistors 201 to 204 and capacitors 205 to 208, and an amplifier circuit composed of transistors 209 to 213 and resistors 214 to 221. This active low-pass filter circuit has a cutoff frequency high enough so as not to deleteriously affect the composite signal. By way of example, the cutoff frequency selected is approximately 80 KHz.

The filter circuit ALPF is not always required. Since, however, the time when the gate transistor 136 turns "off" after the detection of the jamming signal and the time when the FM detection signal appears at the terminal 5 can be adjusted owing to the delay characteristic of this filter circuit ALPF, the leakage of the jamming signal to the emitter of the gate transistor 136 can be lessened by the provision of the filter circuit ALPF.

A capacitor 138 is connected to the emitter of the gate transistor 136 through the terminal 6 as well as a resistor 137. During the period of the "off" state of the gate transistor 136, the capacitor 138 maintains as FM detection signal level immediately before the establishment of the "off" state. As a result, the signal of the terminal 6 becomes devoid of the jamming signals as shown at K in FIG. 3.

If, in case where the jamming signals appear in succession in a short time, the gate transistor 136 is turned "off" in response to all the jamming signals, the period of the FM detection signal to be transferred to the terminal 6 will be conspicuously shortened or will become almost null. According to this embodiment, the operation of the gate transistor 136 is limited as to the successive jamming signals in a short time, whereby desirable reception is possible even in the presence of a large number of jamming signals. The capacitor 119 of the Schmitt trigger circuit SMT, and a resistor 120, transistors 121 to 124 and resistors 125 and 126 are used to limit operation.

The capacitor 119 is charged during the periods in which the transistor 109 of the Schmitt circuit is in the "on" state, for example, periods $t_1-t_2$, $t_3-t_4$, $t_5-t_6$ and $t_7-t_8$. Charges stored in the capacitor 119 are discharged through the resistor 118 during the periods in which the transistor 109 is in the "off" state. As a result, the voltage of the capacitor 119 varies as shown at E in FIG. 3.

The voltage of the capacitor 119 is applied to the base of the transistor 121 through the terminal 13 and resistor 120. The transistor 121 is in the "on" state during the periods in which the voltage of the capacitor 119 remains the base-emitter forward bias voltage thereof, for example, periods $t_9-t_{10}$ and $t_{11}-t_{12}$. (In case of a jamming signal of one shot, the base voltage of the transistor 121 does not become equal to or greater than $V_{BE}$, so that this transistor does not attain the "on" state.) Owing to the connection of the transistors 121 to 124, a collector current flows to the collector of the transistor 124 during, for example, the periods $t_9-t_{10}$ and $t_{11}-t_{12}$ as shown at F in FIG. 3.

As stated before, the collector current of the transistor 124 and that of the transistor 84 are impressed on the transistor 94 of the current Miller circuit. Therefore, in a case where the jamming signals have appeared in a short time as shown by $N_1$, $N_2$, $N_3$, $N_4$ and $N_5$ at A in FIG. 3, any signal for triggering the Schmitt trigger circuit is not produced by the jamming signals $N_3$ and $N_5$ as seen from G in FIG. 3.

The output of the gate transistor 136 is supplied to transistors 139, 140 in Darlington connection. From the emitter of the transistor 140, it is supplied to a stereo demodulation circuit 144 through the terminal 7 and coupling capacitor 143. As explained above, the period during which the jamming signals are suppressed is determined by the time constant of the integration circuit INT1 or those of the integration circuits INT1 and INT2. This period becomes substantially one cycle of the pilot signal or longer. Accordingly, when it is intended to sample the pilot signal from the output side of the gate transistor 136, the state in which absolutely no pilot signal component exists continues for one cycle or a longer period, and it is difficult to accurately perform the reproduction of the pilot signal.

In this invention, accordingly, the pilot signal is supplied from the output of the active low-pass filter circuit ALPF to a 38 KHz-subcarrier generator circuit 147 which is made up of a phase locked loop. At this time, the pilot signal includes the jamming signals, but there are almost no cases where the pilot signal component is lacking completely over one cycle of the pilot signal or a longer period.

The stereo demodulation circuit 144 receives the 38 KHz-signal of the circuit 147, and supplies the left signal to a line 145 and the right signal to a line 146.

Figure 2:
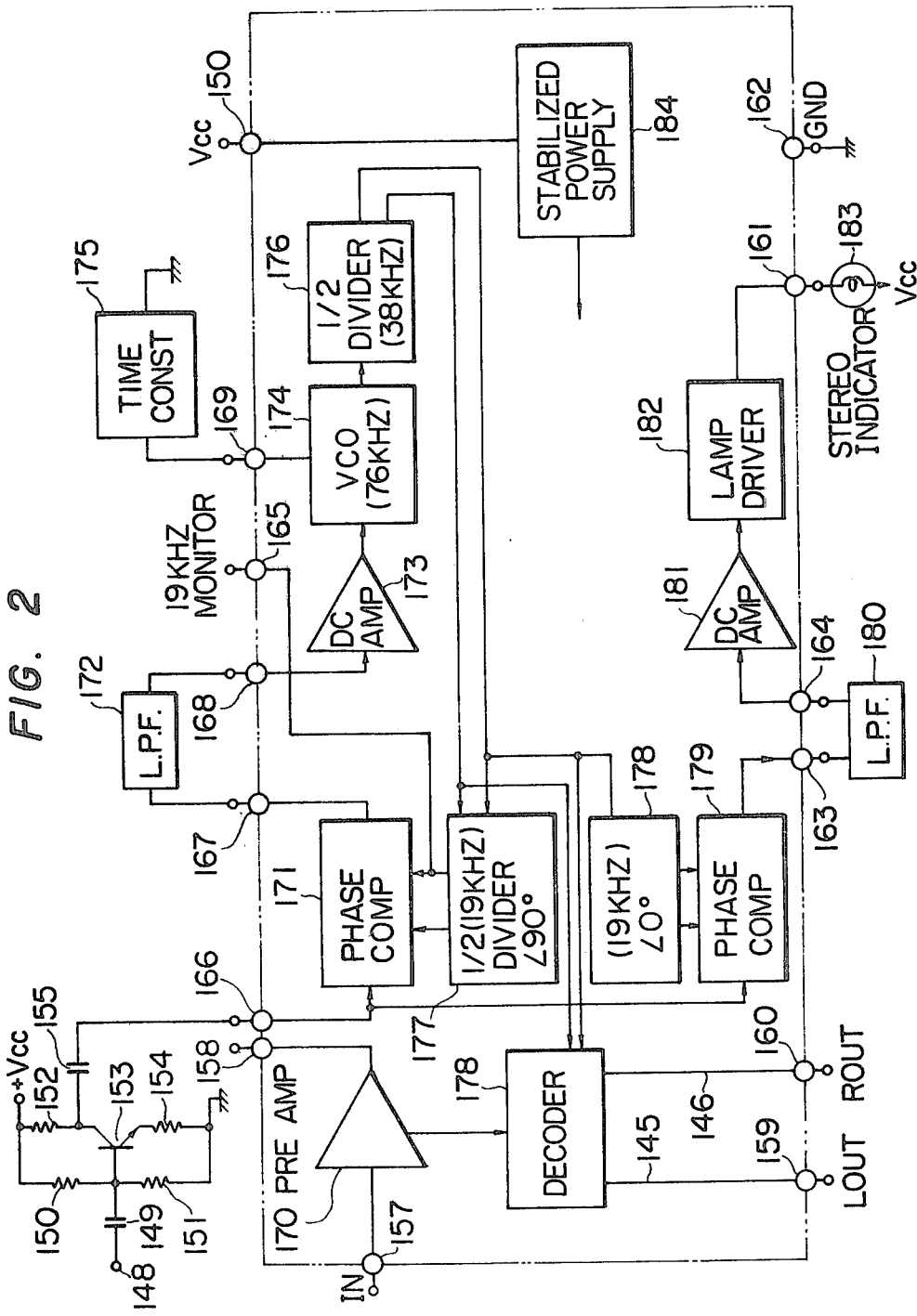
FIG. 2 is a detailed block diagram of a stereo demodulation circuit and a subcarrier generator circuit which are included in the embodiment.

By way of example, a semiconductor integrated circuit of trade name "HA 1156W" (Hitachi Ltd.) can be used for the circuits 144 and 147. FIG. 2 shows a block diagram of the circuit "HA 1156W" and additional circuitry for practicing the present embodiment.

The signal from the coupling capacitor 143 in FIG. 1B with the jamming signals eliminated is supplied to a pre-amplifier circuit 170 in FIG. 2 through a terminal 157. The pre-amplifier circuit 170 has two output terminals. One of them is connected to an external terminal 158, which is made open. The other terminal is situated within the semiconductor integrated circuit device, and is connected to a stereo demodulation circuit or decoder of the switching system 178.

A signal on a line 148 connected to the output end of the active low-pass filter circuit in FIG. 1A is supplied through a coupling capacitor 149 to an amplifier circuit which is composed of resistors 150 to 152 and 154 and a transistor 153. An output of this amplifier circuit is supplied to an input terminal 166 through a coupling capacitor 155. From the input terminal 166, it is supplied to a phase locked loop which is composed of a phase comparator circuit 171, a low-pass filter circuit 172, an amplifier circuit 173, a voltage-controlled oscillator circuit 174 and frequency demultiplier circuits 176 and 177. A 38 KHz-switching signal synchronized with the 19 KHz-pilot signal is obtained from the frequency demultiplier circuit 176, and is supplied to the decoder 178. The terminal 166 is also connected to another phase comparator circuit 179. The phase comparator circuit 179 compares the phases of the pilot signal at the terminal 166 and the 19 KHz-signal from the frequency demultiplier circuit 178. In case of the stereo broadcast reception, it controls a low-pass filter circuit 180, an amplifier circuit 181 and a lamp driver circuit 182 so as to light up a stereo indicating lamp 183.

In FIGS. 1A and 1B, resistors 60, 78, 104, 219, 135 and 141 within the IC are not directly relevant to the circuit operation. They prevent excess currents from flowing through the transistors due to undesired short-circuiting of the corresponding terminals 15, 8, 12, 5, 6 and 7 to the earth point of the circuit, and thereby prevent the transistors from breaking down.

This embodiment is of the system in which, in order to reproduce the 38 KHz-subcarrier, the FM detection signal is directly supplied to the circuit 147 without the intervention of the gate transistor 136. Therefore, even in the period in which the gate transistor is "off", the subcarrier can be obtained on the basis of the pilot signal included in the received broadcast signal, so that the subcarrier can be reproduced even in the presence of conspicuous jamming signals, and so that a good subcarrier phase characteristic can be attained.

In the system of this embodiment, the phase locked loop circuit can be replaced with, for example, a circuit in which a 19 KHz-signal is reproduced by a parallel resonance circuit resonating with the 19 KHz-pilot signal, whereupon a 38 KHz-signal is obtained from the reproduced signal. The phase locked loop circuit, however, is more meritorious in that an adjustment as in the parallel resonance circuit is unnecessary and in that signals stable against disturbance such as jamming signals are generated because it has a response characteristic to the disturbance lower than that of the parallel resonance circuit.

This invention is not restricted to the circuit arrangement of the embodiment. By way of example, although in the embodiment the signal from the terminal 5 is supplied to the circuit 147 for reproducing the subcarrier, it is also possible to supply a signal to the circuit 147 through another low-pass filter circuit or the like which receives the signal from the terminal 3. Although, in this case, the number of circuit elements increase to some extent, it is easier to adjust a phase shift ascribable to the low-pass filter circuit or the like to be added anew to the phase shift of the signal caused by the delay time which has been obtained by the active low-pass filter circuit in order to eliminate the jamming signals with the gate transistor 136. That is, a subcarrier of good phase is obtainable. An amplifier circuit indicated at 149 to 155 in FIG. 2 can be dispensed with in a case where the level of the FM detection signal is high or in a case where the signal level required in the phase locked loop is low.

In order to limit the noise level in the signal to be impressed on the terminal 166, a limiter circuit can be incorporated in a line extending between the terminal 5 and the terminal 166.

We claim:

1. In an FM stereo demodulation system having
    detection means which receives a detected stereo composite signal and which detects a noise pulse in said detected stereo composite signal;
    gate means which receives said detected stereo composite signal at a first terminal thereof and a control terminal thereof being controlled by a control signal obtained from said detection means so as to derive a noise-suppressed signal from a second terminal thereof;
    reproduction means which receives said detected stereo composite signal without intervention of said gate means and which reproduces a subcarrier signal for stereo signal demodulation in synchronism with a pilot signal in said detected stereo composite signal; and
    an FM stereo demodulation means which receives said noise-suppressed signal and said subcarrier signal so as to derive a left signal and a right signal;
    the improvement wherein
    said reproduction means comprises a phase locked loop circuit which includes
    a phase comparator circuit having a first input coupled to receive said pilot signal and a second input;
    a low-pass filter circuit coupled to the output of said phase comparator circuit,
    a voltage controlled oscillator circuit coupled to the output of said low-pass filter circuit, and
    a frequency divider circuit coupled to the output of said voltage controlled oscillator circuit, the output of said frequency divider circuit providing a 19 KHz signal that is coupled to the second input of said phase comparator circuit.

2. An improved FM stereo demodulator system according to claim 1, wherein said detection means includes a Schmitt trigger circuit triggered in response to said noise pulse so as to suppress said noise pulse, and an integration circuit coupled to said Schmitt trigger circuit for determining the period during which a noise pulse is suppressed, and wherein said period is equal to at least substantially one cycle of said pilot signal.

* * * * *